(12) United States Patent
Kando

(10) Patent No.: US 7,772,942 B2
(45) Date of Patent: Aug. 10, 2010

(54) ELASTIC WAVE FILTER UTILIZING A SUB-PROPAGATION MODE RESPONSE TO INCREASE OUT OF BAND ATTENUATION

(75) Inventor: Hajime Kando, Ritto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/166,424

(22) Filed: Jul. 2, 2008

(65) Prior Publication Data
US 2008/0258846 A1   Oct. 23, 2008

Related U.S. Application Data

(63) Continuation of application No. PCT/JP2006/325910, filed on Dec. 26, 2006.

(30) Foreign Application Priority Data

Jan. 6, 2006   (JP) .............................. 2006-001290

(51) Int. Cl.
    *H03H 9/64* (2006.01)
(52) U.S. Cl. ................... 333/193; 310/313 B
(58) Field of Classification Search ......... 333/193–196; 310/313 B, 313 D
See application file for complete search history.

(56) References Cited

U.S. PATENT DOCUMENTS

| | | | |
|---|---|---|---|
| 5,831,493 A * | 11/1998 | Ushiroku | .................... 333/193 |
| 6,025,763 A * | 2/2000 | Morimoto | .................... 333/195 |
| 6,137,380 A * | 10/2000 | Ushiroku et al. | ............ 333/193 |
| 6,317,014 B1 | 11/2001 | Kadota | |
| 7,322,093 B2 | 1/2008 | Kadota et al. | |
| 2004/0130239 A1* | 7/2004 | Kando et al. | ............ 310/313 R |
| 2006/0071579 A1 | 4/2006 | Kando | |
| 2007/0001549 A1* | 1/2007 | Kando | ........................ 310/320 |
| 2007/0007852 A1 | 1/2007 | Kando | |
| 2007/0222337 A1 | 9/2007 | Kadota et al. | |
| 2007/0284965 A1 | 12/2007 | Kadota et al. | |

FOREIGN PATENT DOCUMENTS

JP   60-249411 A   12/1985

(Continued)

OTHER PUBLICATIONS

Official communication issued in the International Application No. PCT/JP2006/325910, mailed on Apr. 17, 2007.

*Primary Examiner*—Barbara Summons
(74) *Attorney, Agent, or Firm*—Keating & Bennett, LLP

(57) ABSTRACT

An elastic wave filter of a resonator type includes at least one IDT electrode arranged so as to contact the piezoelectric substance. The elastic wave filter is arranged such that an elastic wave in a main propagation mode for obtaining target frequency characteristics and an elastic wave in a sub-propagation mode propagate, the elastic wave being capable of propagating simultaneously with the elastic wave in the main propagation mode, an electromechanical coefficient $K^2$ of the elastic wave in the sub-propagation mode is in the range from about 0.1% to about one third of an electromechanical coefficient $K^2$ of the elastic wave in the main propagation mode, and a sound velocity of the elastic wave in the sub-propagation mode differs from a sound velocity of the elastic wave in the main propagation mode.

6 Claims, 5 Drawing Sheets

FOREIGN PATENT DOCUMENTS

| | | |
|---|---|---|
| JP | 06-260876 A | 9/1994 |
| JP | 10-084245 A | 3/1998 |
| JP | 2005-295202 A | 10/2005 |
| WO | WO 2004/070946 * | 8/2004 |
| WO | WO 2005/069485 * | 7/2005 |

* cited by examiner

ELASTIC WAVE FILTER UTILIZING A SUB-PROPAGATION MODE RESPONSE TO INCREASE OUT OF BAND ATTENUATION

BACKGROUND OF THE INVENTION

1. Field of the Invention

The present invention relates to a resonator-type elastic wave filter utilizing, for example, a boundary acoustic wave or a surface acoustic wave. More particularly, the present invention relates to an elastic wave filter utilizing an elastic wave in a mode for obtaining a desired passband and an elastic wave in a mode different from the mode for obtaining the desired passband.

2. Description of the Related Art

Various resonator-type surface acoustic wave filters have been disclosed in order to provide size reduction and loss reduction. For surface acoustic wave filters of this type, a significant attenuation amount near the passband and outside the passband is highly desired. In order to increase an attenuation amount outside the band, for example, in Japanese Unexamined Patent Application Publication No. 6-260876, a surface acoustic wave filter apparatus is disclosed in which a trap-type series resonator is connected to a surface acoustic wave filter.

FIG. 9 is a plan view schematically showing an electrode structure of a surface acoustic wave filter apparatus of this type.

In a surface acoustic wave filter apparatus 101 shown in FIG. 9, an electrode structure is arranged on a piezoelectric substrate. That is, a trap-type series resonator 104 is connected between a first-stage resonator-type surface acoustic wave filter 102 and a second-stage resonator-type surface acoustic wave filter 103.

Each of the surface acoustic wave filters 102 and 103 is a 3 IDT resonator-type surface acoustic wave filter which includes three IDTs 102a through 102c or 103a through 103c. Reflectors 102d and 102e are arranged on both sides of a region in which the IDTs 102a through 102c are provided along a surface-wave propagation direction. Similarly, reflectors 103d and 103e are arranged on both sides of a region in which the IDTs 103a through 103c are provided along a surface wave propagation direction.

On the other hand, the series resonator 104 is a one-port SAW resonator which includes an IDT 104a and reflectors 104b and 104c, which are arranged at both sides of the IDT 104a along propagation of a surface wave.

The first stage and the second stage surface acoustic wave filters 102 and 103 are cascade connected between an input terminal 105 and an output terminal 106. However, the trap-type series resonator 104 is connected in series between the surface acoustic wave filters 102 and 103. The trap-type series resonator 104 includes a trap which has a significant attenuation amount in an attenuation area near the passband of a two-stage cascade-connection surface acoustic wave filter apparatus which includes the surface acoustic wave filters 102 and 103. Thus, the attenuation amount outside the passband can be increased, and a steepness of the attenuation characteristics at an end portion of the passband can be increased.

In the surface acoustic wave filter apparatus 101 of the related art, the attenuation amount near the passband can be increased by connecting the trap-type series resonator 104. However, an electrode structure for providing the trap-type series resonator 104 is required, and thus, the chip size of the surface acoustic wave filter apparatus 101 must be increased.

In addition, by connecting the series resonator 104, there is a problem that an insertion loss in the passband is increased.

On the other hand, recently, not only surface acoustic wave filters but also boundary acoustic wave filters utilizing a boundary acoustic wave have been known as elastic wave filters. Similarly, for the boundary acoustic wave filters, without increasing the size thereof, the attenuation amount outside the passband can increased.

SUMMARY OF THE INVENTION

To overcome the problems described above, preferred embodiments of the present invention provide a resonator-type elastic wave filter capable of sufficiently increasing an attenuation amount near the passband without increasing the chip size.

According to a preferred embodiment of the present invention, an elastic wave filter is provided. The elastic wave filter is a resonator type filter including a piezoelectric substance and at least one IDT electrode arranged so as to contact the piezoelectric substance. The elastic wave filter has a configuration in which an elastic wave in a main propagation mode for obtaining target frequency characteristics and an elastic wave in a sub-propagation mode propagate, the elastic wave in the sub-propagation mode being capable of propagating simultaneously with the elastic wave in the main propagation mode, an electromechanical coefficient $K^2$ of the elastic wave in the sub-propagation mode is in the range from about 0.1% to about one third of an electromechanical coefficient $K^2$ of the elastic wave in the main propagation mode, and the sound velocity of the elastic wave in the sub-propagation mode differs from the sound velocity of the elastic wave in the main propagation mode so as to cause a response for the sub-propagation mode to appear at a location related to a frequency at which an attenuation amount is desired to be increased and which is located outside a band.

According to a preferred embodiment of the elastic wave filter according to the present invention, when the sound velocity of the elastic wave in the sub-propagation mode is Vs, the sound velocity of the elastic wave in the main propagation mode is Vm, and Vr=Vs/Vm, Vr is set in the range from about −1.5 to about −1.02 or the range from about +1.02 to about +1.5.

The elastic wave used in the elastic wave filter according to preferred embodiments of the present invention is not particularly specified, and a boundary acoustic wave or a surface acoustic wave may be used.

According to another preferred embodiment of the elastic wave filter according to the present invention, the elastic wave in the main propagation mode is preferably an SH-type boundary wave and the elastic wave in the sub-propagation mode is preferably a P+SV type boundary wave.

According to another preferred embodiment of the elastic wave filter according to the present invention, the elastic wave in the main propagation mode is preferably a P+SV type boundary wave and the elastic wave in the sub-propagation mode is preferably an SH-type boundary wave.

According to another preferred embodiment of the elastic wave filter according to the present invention, the elastic wave in the main propagation mode is preferably an SH-type surface wave and the elastic wave in the sub-propagation mode is preferably a P+SV type surface wave.

According to another preferred embodiment of the elastic wave filter according to the present invention, the elastic wave in the main propagation mode is preferably a P+SV type surface wave and the elastic wave in the sub-propagation mode is preferably an SH-type surface wave.

An elastic wave filter according to a preferred embodiment of the present invention is a resonator-type elastic wave filter including a piezoelectric substance and at least one IDT electrode arranged so as to contact the piezoelectric substance, and has a configuration in which an elastic wave in the main propagation mode for obtaining target frequency characteristics and an elastic wave in a sub-propagation mode propagate, the elastic wave in a sub-propagation mode being capable of propagating simultaneously with the elastic wave in the main propagation mode. The sound velocity of the elastic wave in the sub-propagation mode differs from the sound velocity of the elastic wave in the main propagation mode. Thus, the response for the sub-propagation mode appears at a location related to a frequency different from a location related to a frequency at which the response for the main propagation mode appears. Since the electromechanical coefficient $K^2$ of the elastic wave in the sub-propagation mode is at least about 0.1%, the response for the sub-propagation mode has an amplitude of a certain magnitude at the location related to the frequency different from the location related to the frequency at which the response for the main propagation mode appears.

Thus, by setting the location related to the frequency at which the response for the sub-propagation mode appears to a location related to a frequency at which the attenuation amount of target frequency characteristics outside the passband is desired to be increased, the attenuation amount of the elastic wave filter outside the passband can be increased in accordance with the response for the sub-propagation mode.

In addition, if the electromechanical coefficient $K^2$ for the sub-propagation mode is too large, a spurious response occurs, and preferable frequency characteristics cannot be obtained. In preferred embodiments of the present invention, the electromechanical coefficient of an elastic wave in the sub-propagation mode is set to a value which is about one third of the electromechanical coefficient $K^2$ of an elastic wave in the main propagation mode or less. Thus, the response for the sub-propagation mode does not become a spurious response.

Moreover, as is known, the magnitude of the electromechanical coefficient $K^2$ and the sound velocity for the sub-propagation mode can be easily adjusted by adjusting the film thickness of an IDT electrode, a duty ratio, or the crystal orientation of a piezoelectric substrate. Thus, the attenuation amount outside the passband can be increased without increasing the chip size or increasing insertion loss due to, for example, a spurious response within the band.

If the ratio Vr=Vs/Vm of the sound velocity Vs of an elastic wave in the sub-propagation mode to the sound velocity Vm of an elastic wave in the main propagation mode is set in the range from about −1.5 to about −1.02 or the range from about +1.02 to about +1.5, the attenuation amount outside the passband can be more effectively increased.

In the elastic wave filter according to preferred embodiments of the present invention, a boundary acoustic wave may be utilized, and in that case, an elastic wave in the main propagation mode may be an SH-type boundary wave and an elastic wave in the sub-propagation mode may be a P+SV type boundary wave, for example. In contrast, an elastic wave in the main propagation mode may also be a P+SV type boundary wave and an elastic wave in the sub-propagation mode may also be an SH-type boundary wave, for example. In either case, the attenuation amount outside the passband can be increased without increasing the chip size.

Moreover, in preferred embodiments of the present invention, if an elastic wave in the main propagation mode is an SH-type surface wave or a P+SV type surface wave and an elastic wave in the sub-propagation mode is a P+SV type surface wave or an SH-type surface wave, the attenuation amount outside the passband can be easily increased without increasing the chip size and without, for example, deteriorating insertion loss within the band due to an unwanted spurious response.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

In the following, the present invention will be clarified by describing preferred embodiments according to the present invention with reference to the drawings.

Figure 1A:
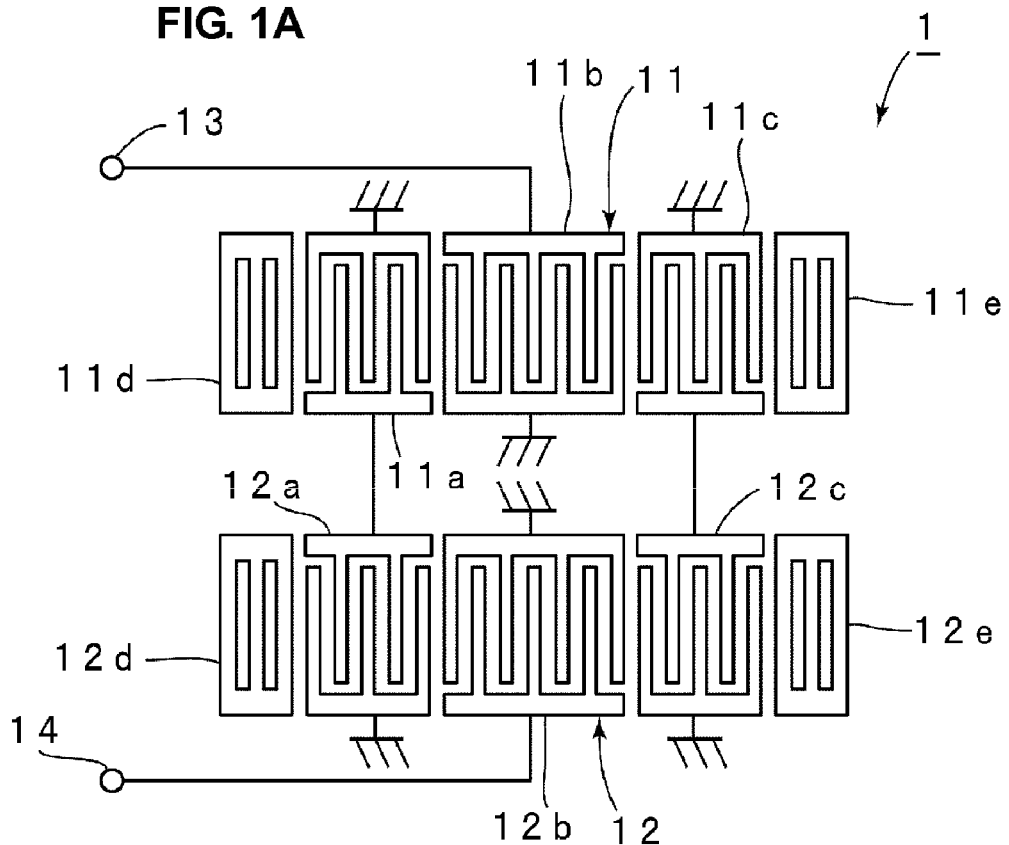
FIGS. 1A and 1B are a schematic front view showing an electrode structure of a boundary acoustic wave filter according to a preferred embodiment of the present invention and a schematic front sectional view of the boundary acoustic wave filter.
Figure 1B:
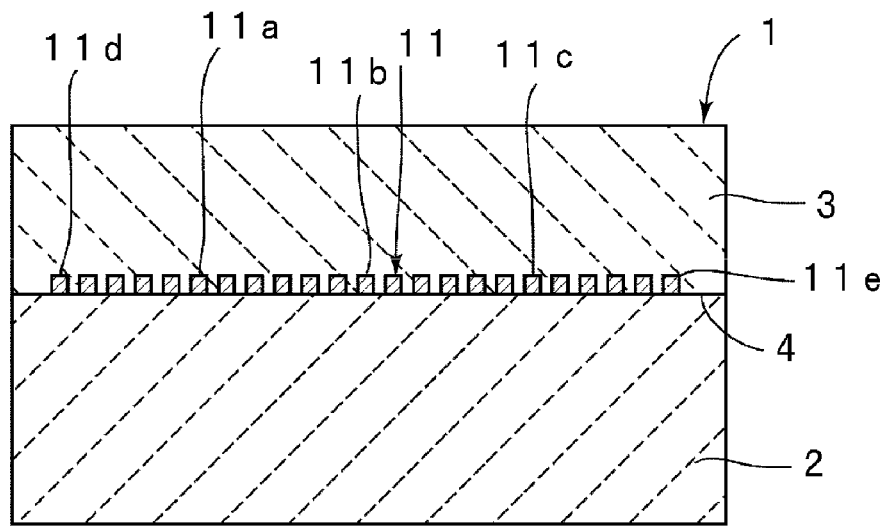

FIGS. 1A and 1B are a schematic front view showing an electrode structure used to describe a boundary acoustic wave filter according to a preferred embodiment of the present invention and a schematic front sectional view showing a structure of the boundary acoustic wave filter.

A boundary acoustic wave filter 1 includes a first medium 2 and a second medium 3. The first medium 2 is defined by a piezoelectric substance. The piezoelectric substance defining the first medium 2 is not particularly limited. However, in this preferred embodiment, the first medium 2 is preferably a 20° Y-cut, 20° X-direction propagation LiNbO₃ substrate, for example.

On the other hand, the medium 3 is made of SiO₂ in this preferred embodiment. However, the medium 3 may be made of any suitable dielectric.

On an interface between the medium 2 and the medium 3, IDT electrodes and reflectors are arranged so as to contact the piezoelectric substance 2. FIG. 1A shows an electrode structure defined by the IDT electrodes and the reflectors.

In this preferred embodiment, a resonator-type first-stage boundary acoustic wave filter 11 and a resonator-type second-stage boundary acoustic wave filter 12 are cascade connected, thereby the boundary acoustic wave filter 1 is provided.

The boundary acoustic wave filters 11 and 12 preferably are both 3-IDT electrode-type resonator-type boundary acoustic wave filters. That is, the boundary acoustic wave filter 11 preferably includes three IDT electrodes 11a through 11c arranged in a boundary wave propagation direction. Reflectors 11d and 11e are arranged at both sides of a portion in which the IDT electrodes 11a through 11c are provided in the boundary acoustic wave propagation direction.

Similarly, the boundary acoustic wave filter 12 includes three IDT electrodes 12a through 12c and reflectors 12d and 12e arranged along the boundary wave propagation direction.

One end of the IDT 11b is electrically connected to an input terminal 13, and one end of the IDT 12b is electrically connected to an output terminal 14. Moreover, one end of the IDT 11a and one end of the IDT 11c are electrically connected to one end of the IDT 12a and one end of the IDT 12c, respectively. The other ends of the IDTs 11a through 11c and IDTs 12a through 12c, the other ends being opposite to the one ends connected as described above, are connected to the ground potential.

FIG. 1B schematically shows such an electrode structure, and shows a portion in which the IDTs 11a through 11c and the reflectors 11d and 11e are arranged.

In the boundary acoustic wave filter 1, if an input signal is applied from the input terminal 13, a boundary acoustic wave is excited at the boundary acoustic wave filters 11 and 12, and an output signal having frequency characteristics based on the excited boundary acoustic wave can be output from the output terminal 14.

In this preferred embodiment, an SH-type boundary wave in the excited boundary acoustic wave is utilized for a main propagation mode, and frequency characteristics according to the main propagation mode are utilized. A characteristic of this preferred embodiment is that not only the SH-type boundary acoustic wave for the main propagation mode but also a response of a P+SV type boundary wave for a sub-propagation mode is utilized.

In boundary acoustic wave filters or surface acoustic wave filters, if an input signal is applied, waves in various modes are excited as boundary acoustic waves or surface acoustic waves. In this case, the main propagation mode providing a passband is selected according to a target frequency band. Waves in modes other than the main propagation mode are unwanted waves, and thus, responses thereof should be as small as possible. For example, if a response of an unwanted wave appears within a passband, a spurious response occurs and frequency characteristics are deteriorated. Moreover, if unwanted waves exist near the passband, a desired attenuation amount cannot be obtained, and the boundary acoustic wave filters or surface acoustic wave filters have been designed so that responses of elastic waves in modes other than the main propagation mode are as small as possible.

In contrast, in the boundary acoustic wave filter 1 according to this preferred embodiment, the P+SV type boundary wave in another mode in addition to the main propagation mode for the SH-type boundary wave is also utilized, thereby the attenuation amount outside the band is increased.

More specifically, in this preferred embodiment, on the higher frequency side of and near the passband obtained in the main propagation mode, the response of the P+SV type boundary wave for the sub-propagation mode occurs so as to have a desired amplitude. As a result, the attenuation amount on the higher frequency side of and near the passband is increased. A detailed description will be provided with reference to FIG. 2 and FIG. 3.

Now, the boundary acoustic wave filter 1 is manufactured by forming the IDT electrodes 11a through 11c and 12a through 12c, and the reflectors 11d, 11e, 12d, and 12e between the LiNbO₃ substrate 2 having the above-described crystal orientation and the medium 3 made of SiO₂ according to the following specification.

The IDT electrodes 11a through 11c and 12a through 12c are made of a multilayer metal film including NiCr that is stacked on and under a Au layer. The film thickness thereof is as follows.

NiCr/Au/NiCr=0.003λ/0.06λ/0.003λ, where λ=3.6 μm.

The duty ratio of the IDT electrodes is preferably about 0.6, for example. The number of pairs of electrode fingers of each of the IDT electrodes 11b and 12b at the center is preferably twelve, for example, and the number of pairs of electrode fingers of each of the other IDT electrodes 11a and 11c, and 12a and 12c is preferably seven, for example. The number of electrode fingers of each of the reflectors 11d, 11e, 12d, and 12e is preferably fifteen, for example.

Moreover, the width of an aperture of each of the IDT electrodes 11a through 11c and 12a through 12c, that is, a dimension of a portion in which a boundary wave propagates in a direction orthogonal to the boundary-acoustic-wave propagation direction is about 183.7 μm, for example.

In the IDT electrodes 12b and 11b, cross-widths are gradually narrowed from the center of each of the IDTs to an end portion of the IDT, and cross widths are weighted so that the cross width at the center of IDT is about 180 μm, for example and the aperture at the end portion of the IDT is about 144 μm, for example.

Figure 2:
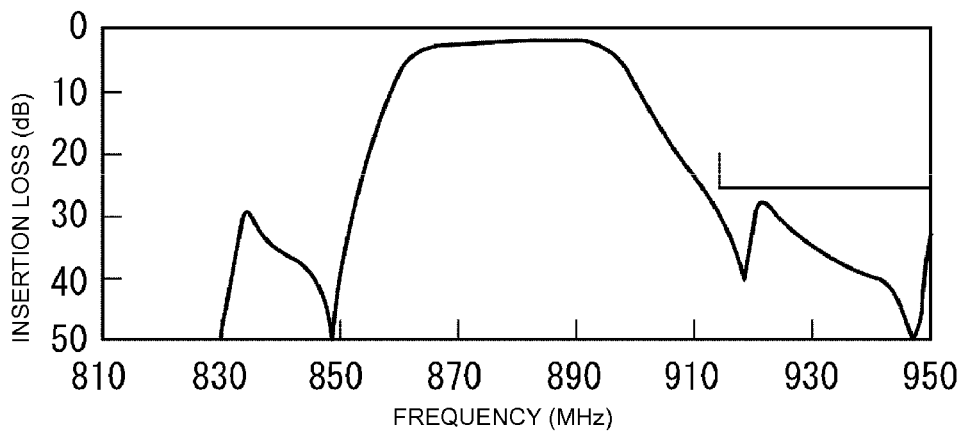
FIG. 2 is a diagram showing filter characteristics of the boundary acoustic wave filter shown in FIGS. 1A and 1B.

In this manner, the boundary acoustic wave filter according to this preferred embodiment is manufactured. The filter characteristics of the boundary acoustic wave filter according to this preferred embodiment are shown in FIG. 2.

For comparison, a boundary acoustic wave filter as a comparison example is manufactured similarly to the above-described preferred embodiment except that a 15° Y-cut 20° X propagation LiNbO$_3$ is used as the first medium 2, the film thickness of the IDT electrodes is NiCr/Au/NiCr=0.003λ/ 0.05λ/0.003λ (λ=3.7 μm), and the duty ratio is about 0.5. The frequency characteristics of the boundary acoustic wave filter are shown in FIG. 3.

Figure 3:
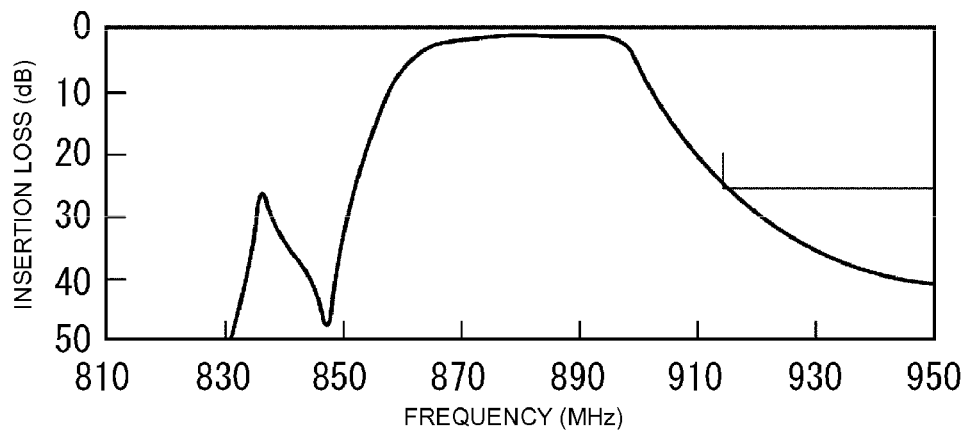
FIG. 3 is a diagram showing frequency characteristics of a boundary acoustic wave filter of a comparison example.

As shown in FIG. 3, in the boundary acoustic wave filter of the comparison example, an attenuation amount has been somewhat increased by cascade connecting a first boundary acoustic wave filter and a second boundary acoustic wave filter in two stages. However, the attenuation amount on the higher frequency side of and near the passband, that is, near about 915 MHz was about 25.3 dB. In contrast, as shown in FIG. 2, in the above-described preferred embodiment, the attenuation amount near about 915 MHz is significantly improved to about 28.4 dB.

This is because the response of the P+SV type boundary wave for the sub-propagation mode appears having a desired amplitude near 915 MHz by changing the crystal orientation of a piezoelectric substance, the thickness of the IDT electrodes, and the duty ratio thereof, and the response is utilized.

That is, in this preferred embodiment, when obtaining filter characteristics by using the SH-type boundary wave, the attenuation amount outside the band is increased by utilizing the response of the P+SV type boundary wave, which previously has been considered to be an unwanted wave. As described above, the response for the sub-propagation mode is coincident with a location of a frequency at which the attenuation amount is desired to be increased, the location of the frequency being outside the passband in the filter characteristics, and the attenuation amount is increased in accordance with the response for the sub-propagation mode. Thus, the amplitude of the response for the sub-propagation mode must be an amplitude capable of increasing the attenuation amount outside the band.

Here, if the ratio of the sound velocity for the main propagation mode to the sound velocity for the sub-propagation mode is relatively small, a ripple is generated by the sub-propagation mode in the passband of the boundary acoustic wave filter 1, and the filter characteristics may be deteriorated. For example, in a longitudinally coupled resonator-type boundary acoustic wave filter, the passband which includes three longitudinally coupled modes including an M0 mode, an M1 mode, and an M2 mode, longitudinal higher modes including the M0 through M2 mode also occur in the ripple generated by the sub-propagation mode. On the other hand, in the sub-propagation mode, frequency differences between modes with respect to the higher modes M0 through M2 mode are determined according to the design of an IDT such as the number of pairs of the electrode fingers of the IDT electrode, and are substantially equal to frequency differences between modes with respect to the longitudinal higher modes M0 through M2 in the main mode. Thus, if the sound velocity for the main propagation mode which includes no ripple because of the sub-propagation mode in the passband is Vm, and if the sound velocity for the sub-propagation mode is Vs, a preferable range of a sound velocity ratio Vr=Vs/Vm can be obtained from the following expression (1) when the center frequency for the main propagation mode is FC, and the bandwidth of the passband is BW.

$$(FC-BW/2-\alpha)/(FC+BW/2)>Vr>(FC+BW/2+\alpha)/(FC-BW/2) \quad (1)$$

Here, α is a coefficient that is provided when the response of a side lobe in the sub-propagation mode responds even to the passband of the main propagation mode and causes fine ripples to occur at a pass end of the filter, is a value obtained experimentally, and is a value which is preferably about 0 to about 4 times the bandwidth BW, for example.

In the filter characteristics shown in FIG. 2, the center frequency of the SH-type boundary wave for the main propagation mode is preferably about 879.4 MHz, for example, the bandwidth BW is preferably about 35.5 MHz, for example, Vr is preferably about 1.15, for example, and α is preferably about 2.65 MHz, for example.

In standards regarding the attenuation amount of RF filters for use in cellular telephones, when the center frequency of the passband is f0, the band from −f0×1.5 to −f0×1.02 and the band from f0×1.02 to f0×1.5 are often set. In particular, since the attenuation amount in an attenuation area closest to the passband often causes problems, Vr is preferably set in the range from about −1.5 to about −1.02 or in the range from about +1.02 to about +1.5, thereby the attenuation amount near the passband can be effectively increased.

Figure 4:
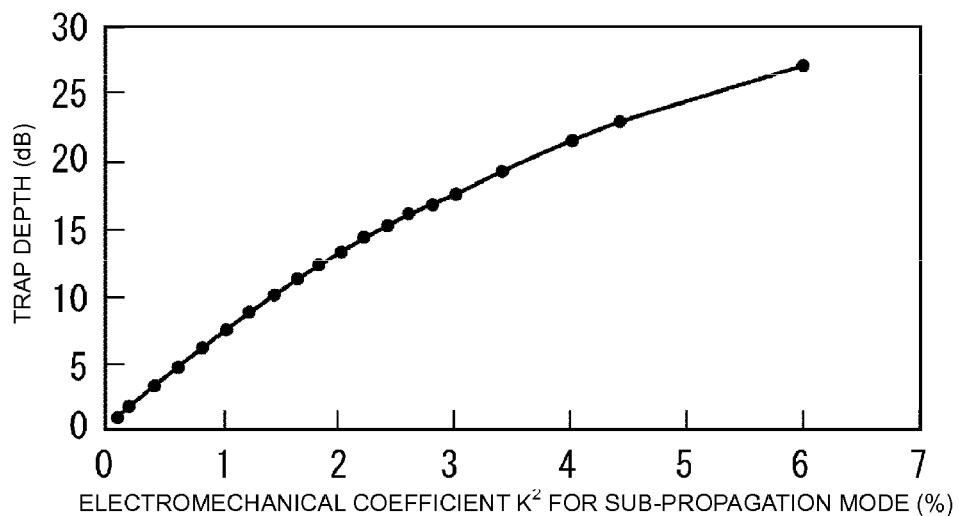
FIG. 4 is a diagram used to describe the change in trap depth that appears near a passband when an electromechanical coefficient $K^2$ of a P+SV type for a sub-propagation mode is changed.

FIG. 4 is a diagram showing how trap depth according to the response of the P+SV type boundary wave which appears on the higher frequency side of the passband of the SH-type boundary wave for the main propagation mode changes with electromechanical coefficient $K^2$ of the P+SV type boundary wave.

Here, a trap depth (dB) on the longitudinal axis of FIG. 4 is not intended to match the attenuation amount near about 915 MHz in the frequency characteristics shown in FIG. 2, and just refers to a trap depth corresponding to an insertion loss difference between at a resonance point and at an anti-resonance point of the response of the P+SV type boundary wave. There is a correlation between the attenuation amount near about 915 MHz on the higher frequency side of the passband in the boundary acoustic wave filter 1 and the trap depth on the longitudinal axis of FIG. 4. There is a relationship such that if the trap depth is increased, the attenuation amount near about 915 MHz in the boundary acoustic wave filter 1 is increased.

As shown in FIG. 4, if the electromechanical coefficient $K^2$ of the P+SV type boundary wave for the sub-propagation mode is increased, the trap depth is increased and it is clear that the attenuation amount on the higher frequency side of the passband in the boundary acoustic wave filter 1 can be increased. In particular, when the electromechanical coefficient $K^2$ for the sub-propagation mode is at least about 0.1%, it is clear that the trap depth can be greater than that where the response for the sub-propagation mode is not utilized.

If the electromechanical coefficient $K^2$ for the sub-propagation mode becomes too large, a spurious response generated by the sub-propagation mode appears near the passband, and the frequency characteristics are deteriorated. Thus, the electromechanical coefficient $K^2$ for the sub-propagation mode is set to be about one third of the electromechanical coefficient $K^2$ for the main propagation mode or less. For example, in the example shown in FIG. 4, the electromechanical coefficient $K^2$ for the main propagation mode is preferably about 16%, for example, the electromechanical coefficient $K^2$ for the sub-propagation mode is preferably about 5.3% or less. Thus, as is clear from FIG. 4, the trap depth is sufficiently large and the attenuation amount on the higher frequency side of the passband can be effectively increased.

Here, compared with the boundary acoustic wave filter of the comparison example, in this preferred embodiment, the crystal orientation of the piezoelectric substance and the film thickness of and the duty ratio of the IDT electrodes are changed. As a result, the response for the sub-propagation mode is located on the higher frequency side of and near the passband obtained according to the main propagation mode, and the response for the sub-propagation mode is utilized. As is known, in elastic wave apparatuses utilizing a boundary acoustic wave or surface acoustic wave, it is known that, for each of the modes, a location related to the frequency of the response and an electromechanical coefficient can be adjusted by changing the crystal orientation, the film thickness of and the duty ratio of the IDT electrodes, and other characteristics of the elastic wave apparatus. Thus, as in the above-described preferred embodiment, causing the response for the sub-propagation mode to be located at a location related to a frequency at which the attenuation amount outside the band is desired to be increased, and adjusting of the amplitude of the response can be achieved by changing the material of and the crystal orientation of the piezoelectric substance, and by changing the film thickness of and the duty ratio of the IDT electrodes. This will be described with reference to FIG. 5 through FIG. 8.

In the following, the changes in the sound velocity and electromechanical coefficient will be described where the IDT electrodes made of Au are arranged on an interface between a first medium defined by a 15° Y-cut X-propagation $LiNbO_3$ substrate, that is, a $LiNbO_3$ substrate with Euler angles (0°, 105°, 0°) and a second medium composed of $SiO_2$.

Figure 5:
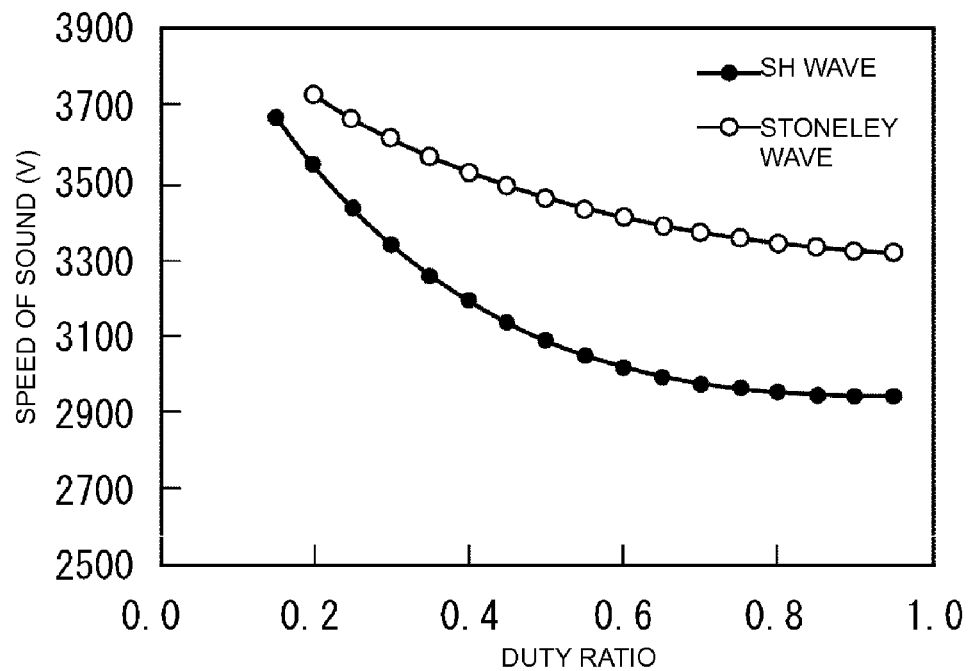
FIG. 5 is a diagram showing, when an IDT electrode which is made of Au and has a film thickness of about 0.06λ is arranged on an interface between a 15° Y-cut X propagation $LiNbO_3$ and $SiO_2$, a relationship between a duty ratio of the IDT electrode and the sound velocity regarding an SH-type boundary wave and a relationship between a duty ratio of the IDT electrode and the sound velocity regarding a Stoneley wave.
Figure 6:
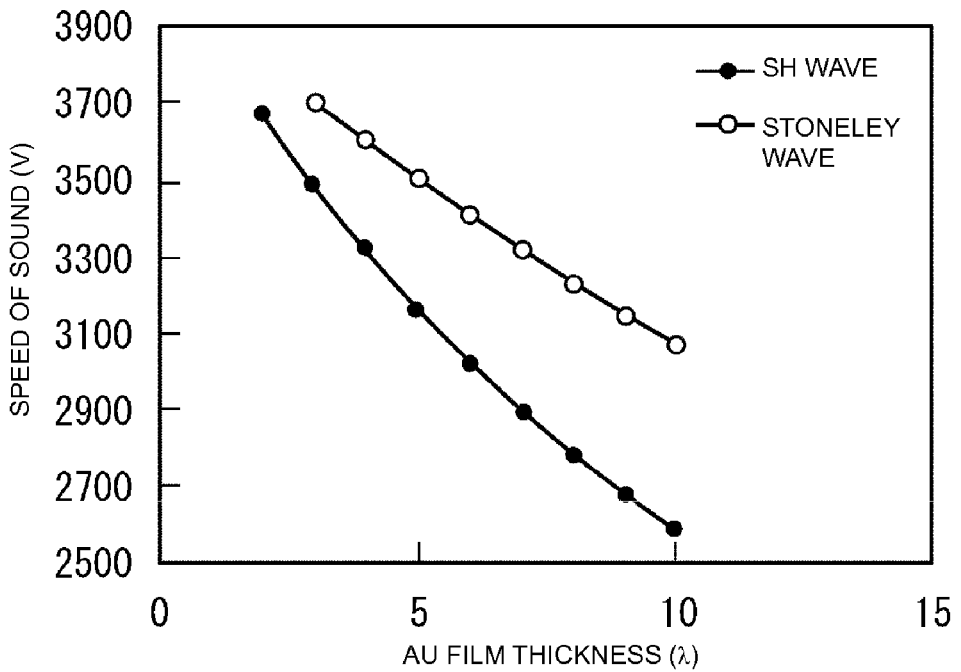
FIG. 6 is a diagram showing, when an IDT electrode which is made of Au and has a duty ratio of about 0.6 is arranged on the interface between the 15° Y-cut X propagation $LiNbO_3$ and $SiO_2$, a relationship between a film thickness of an IDT composed of Au in the IDT electrode and the sound velocity regarding the SH-type boundary wave and a relationship between a film thickness of an IDT composed of Au in the IDT electrode and the sound velocity regarding the Stoneley wave.
Figure 7:
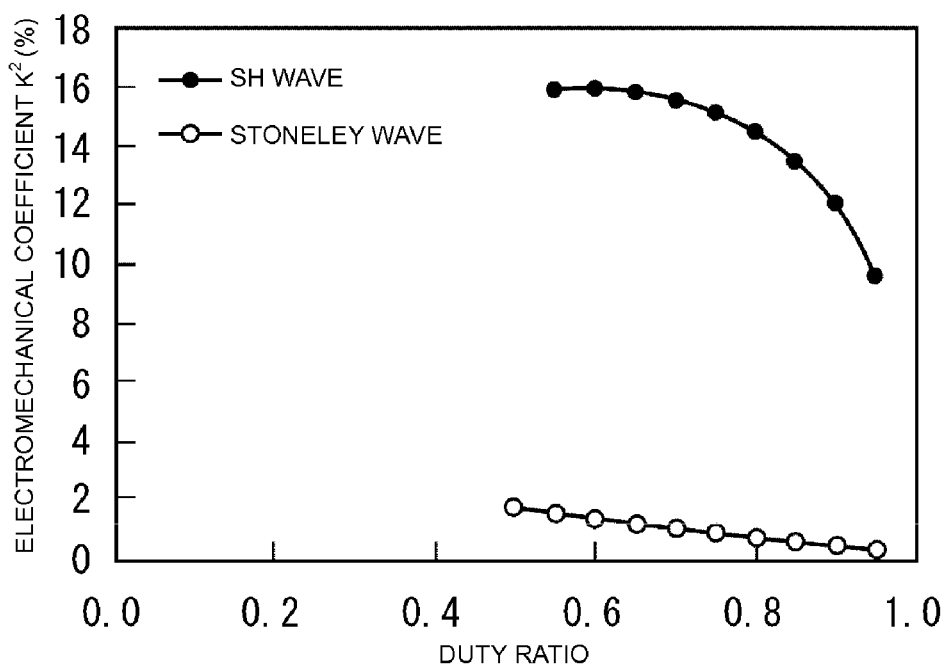
FIG. 7 is a diagram showing, when the IDT electrode which is made of Au and has a film thickness of about 0.06λ is arranged on the interface between the 15° Y-cut X propagation $LiNbO_3$ and $SiO_2$, a relationship between a duty ratio of the IDT electrode and an electromechanical coefficient $K^2$ of the SH-type boundary wave and a relationship between a duty ratio of the IDT electrode and an electromechanical coefficient $K^2$ of the Stoneley wave.
Figure 8:
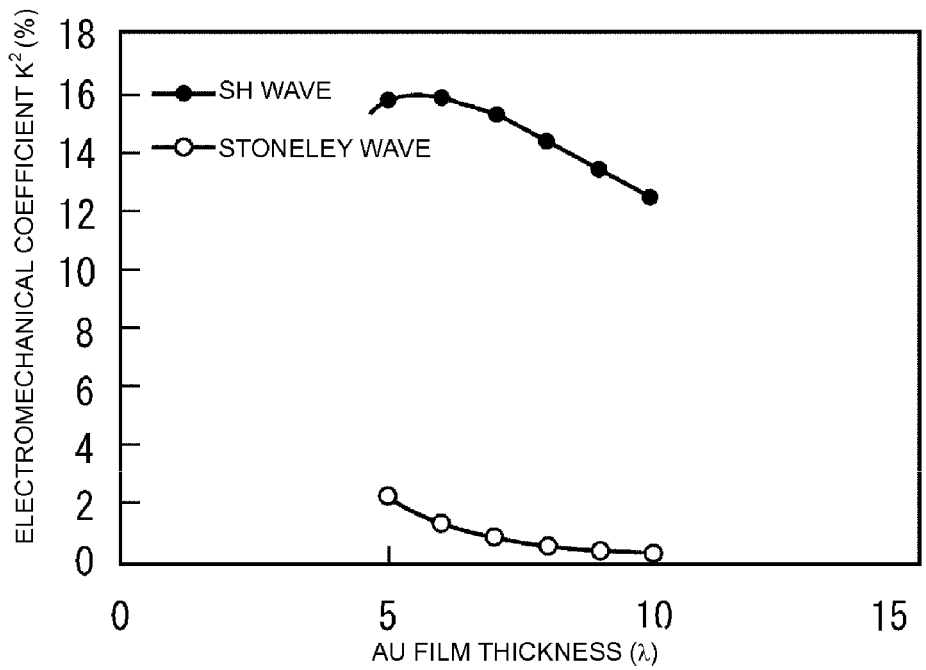
FIG. 8 is a diagram showing, when the IDT electrode which is made of Au and has a duty ratio of about 0.6 is arranged on the interface between the 15° Y-cut X propagation $LiNbO_3$ and $SiO_2$, a relationship between the film thickness of the IDT composed of Au and an electromechanical coefficient $K^2$ of the SH-type boundary wave and a relationship between the film thickness of the IDT composed of Au and an electromechanical coefficient $K^2$ of the Stoneley wave.
Figure 9:
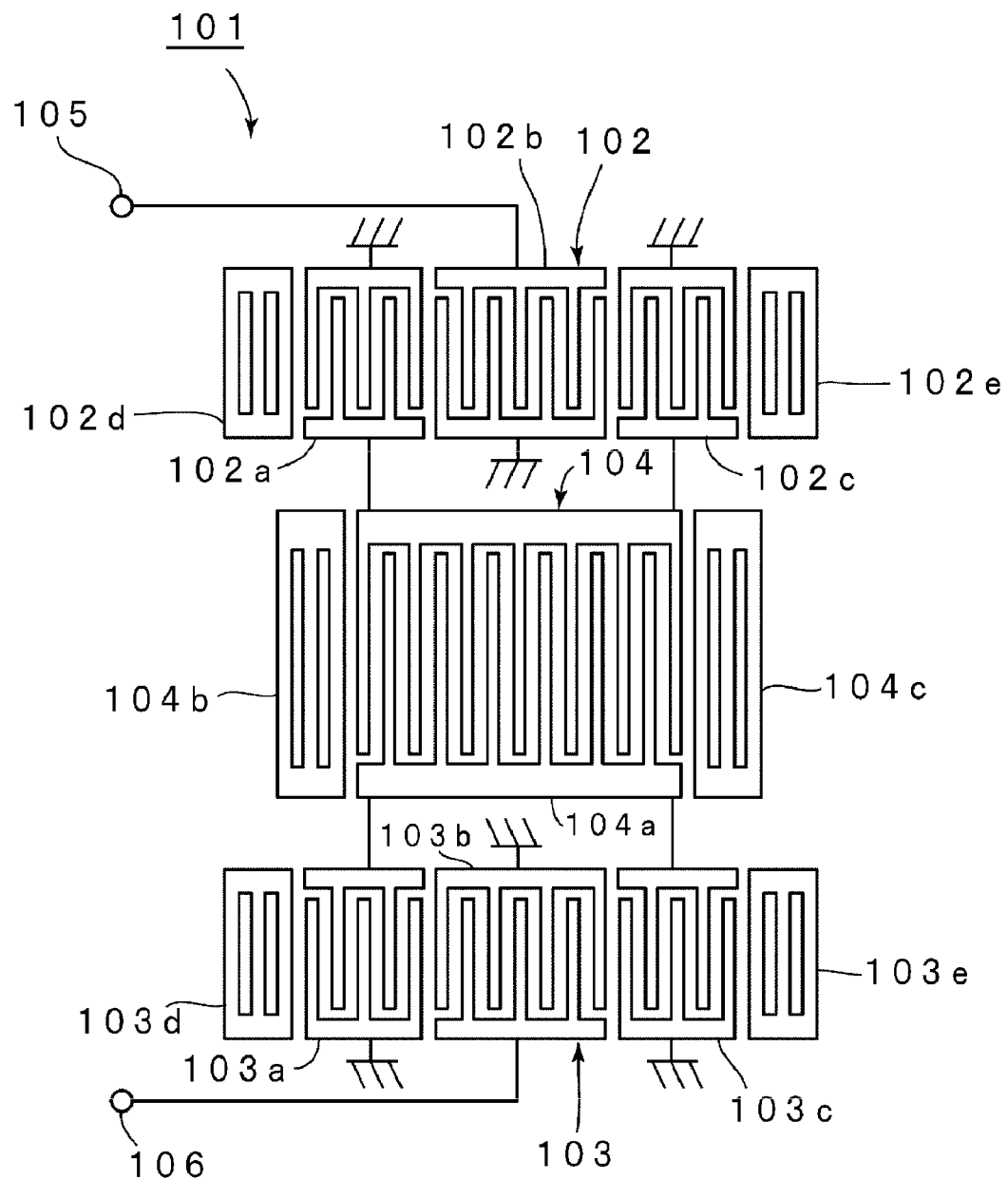
FIG. 9 is a schematic plan view showing an electrode structure of a surface acoustic wave filter apparatus of an example of the related art.

FIG. 5 shows the change in the sound velocity of the SH-type boundary wave and the change in the sound velocity of a Stoneley wave when the film thickness of the IDT electrodes is about 0.06λ and the duty ratio thereof is changed. Moreover, FIG. 6 shows the change in the sound velocity of the SH-type boundary wave and the change in the sound velocity of a Stoneley wave where the duty ratio of the IDT electrodes is about 0.6 and the film thickness of the IDT electrodes is changed. FIG. 7 shows the change in the sound velocity of the SH-type boundary wave, the change in the sound velocity of a Stoneley wave, and the change in electromechanical coefficient $K^2$ where the film thickness of the IDT electrodes is about 0.06λ and the duty ratio thereof is changed. FIG. 8 shows the change in the electromechanical coefficient $K^2$ of the SH-type boundary wave and the change in the electromechanical coefficient $K^2$ of a Stoneley wave where the duty ratio of the IDT electrodes is about 0.6 and the thickness of the IDT electrodes is changed.

As is clear from FIG. 5 through FIG. 8, the SH-type boundary wave utilized for the main propagation mode and the Stoneley wave utilized for the sub-propagation mode are not always coincident with the tendency of change according to the thickness of the Au layer. Therefore, in order to form the passband according to the SH-type boundary wave and to increase an attenuation amount on the higher frequency side of the passband by using the Stoneley wave, the duty ratio or the thickness of the Au layer can be selected so as to be capable of exciting the SH-type boundary wave and the Stoneley wave.

For example, the passband is formed according to the response of the SH-type boundary wave, that is, an arrangement in which the SH-type boundary wave is used for the main propagation mode will be described. In this case, the Stoneley wave will be utilized for the sub-propagation mode. Thus, in order to increase the attenuation amount on the higher frequency side of and near the passband, the location related to the frequency of the response of the Stoneley wave, that is, the sound velocity of the Stoneley wave, must be coincident with the location related to the frequency at which the attenuation amount on the higher frequency side of and near the passband is desired to be increased. The sound velocity of the SH-type boundary wave is determined according to the center frequency of the passband, which is a target. The electromechanical coefficient $K^2$ of the SH-type boundary wave must be set as large as possible, and the electromechanical coefficient $K^2$ of the Stoneley wave must be set to a value sufficient to cause the attenuation amount on the higher frequency side of the passband to be increased as described above. That is, as described above, the electromechanical coefficient $K^2$ of the Stoneley wave must be set to a value from about 0.1% to about one third of the electromechanical coefficient $K^2$ for the main propagation mode, for example.

Here, FIG. 5 through FIG. 8 show changes in the sound velocity and electromechanical coefficient $K^2$ of the Stoneley wave and SH-type boundary wave with respect to the duty ratio and the thickness of the Au layer. However, the sound velocity and electromechanical coefficient $K^2$ of the SH-type boundary wave and the sound velocity and electromechanical coefficient $K^2$ of the Stoneley wave change according to the crystal orientation of the piezoelectric substance used, as described above.

Here, in the above-described preferred embodiment, a boundary acoustic wave filter of the two-stage connection type has been described. However, it is not limited to the two-stage connection type as long as it is a resonator-type boundary acoustic wave filter, and preferred embodiments of the present invention may be applied to various resonator-type boundary acoustic wave filters. Moreover, in boundary acoustic waves, a case in which the SH-type boundary wave is utilized for the main propagation mode has been described. However, in contrast, the P+SV type boundary wave, such as the Stoneley wave, may be utilized for the main propagation mode, and the SH-type boundary wave may be used for the sub-propagation mode.

In addition, the present invention may be applied not only to boundary acoustic waves but also to resonator-type surface acoustic wave filters. That is, in a resonator-type surface acoustic wave filter, if an input signal is applied, similarly to a boundary wave filter, a plurality of modes propagate similarly to a boundary wave filter. However, by using the main propagation mode for obtaining the passband and using a propagation mode different from the main propagation mode as a sub-propagation mode among these propagation modes, the attenuation amount outside the passband can be increased similarly to the above-described preferred embodiment.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An elastic wave filter of a resonator type comprising:
   a piezoelectric substance; and
   at least one IDT electrode arranged so as to contact the piezoelectric substance; wherein
   the elastic wave filter is arranged such that an elastic wave in a main propagation mode for obtaining target frequency characteristics and an elastic wave in a sub-propagation mode propagate, the elastic wave in the sub-propagation mode being capable of propagating simultaneously with the elastic wave in the main propagation mode;
   an electromechanical coefficient $K^2$ of the elastic wave in the sub-propagation mode is within a range from about 0.1% to about one third of an electromechanical coefficient $K^2$ of the elastic wave in the main propagation mode; and
   a sound velocity of the elastic wave in the sub-propagation mode differs from a sound velocity of the elastic wave in the main propagation mode so as to cause a response for the sub-propagation mode to occur at a location related to a frequency at which an attenuation amount is desired to be increased and which is located outside a band.

2. The elastic wave filter according to claim 1, wherein when the sound velocity of the elastic wave in the sub-propagation mode is Vs, the sound velocity of the elastic wave in the main propagation mode is Vm, and Vr=Vs/Vm, Vr is within a range from about −1.5 to about −1.02 or in a range from about +1.02 to about +1.5.

3. The elastic wave filter according to claim 1, wherein The elastic wave in the main propagation mode is an SH-type boundary wave and the elastic wave in the sub-propagation mode is a P+SV type boundary wave.

4. The elastic wave filter according to claim 1, wherein the elastic wave in the main propagation mode is a P+SV type boundary wave and the elastic wave in the sub-propagation mode is an SH-type boundary wave.

5. The elastic wave filter according to claim 1, wherein the elastic wave in the main propagation mode is an SH-type surface wave and the elastic wave in the sub-propagation mode is a P+SV type surface wave.

6. The elastic wave filter according to claim 1, wherein the elastic wave in the main propagation mode is a P+SV type surface wave and the elastic wave in the sub-propagation mode is an SH-type surface wave.

* * * * *